(12) United States Patent
Wang

(10) Patent No.: US 6,395,693 B1
(45) Date of Patent: *May 28, 2002

(54) CLEANING SOLUTION FOR SEMICONDUCTOR SURFACES FOLLOWING CHEMICAL-MECHANICAL POLISHING

(75) Inventor: Shumin Wang, Naperville, IL (US)

(73) Assignee: Cabot Microelectronics Corporation, Aurora, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/405,249

(22) Filed: Sep. 27, 1999

(51) Int. Cl.[7] .............................. C11D 3/30; C11D 7/36
(52) U.S. Cl. ....................... 510/175; 510/176; 510/178; 510/432; 510/433; 510/434; 510/435; 510/436; 510/477; 510/488; 510/499; 134/1.3
(58) Field of Search ................................ 510/175, 176, 510/178, 432, 433, 434, 435, 436, 477, 488, 499

(56) References Cited

U.S. PATENT DOCUMENTS

| | | | |
|---|---|---|---|
| 3,072,502 A | 1/1963 | Alfano ........................... 134/3 |
| 3,438,811 A | 4/1969 | Harriman et al. ............... 134/2 |
| 4,051,057 A | 9/1977 | Ericson et al. ............... 252/100 |
| 4,174,290 A | 11/1979 | Leveskis ...................... 252/142 |
| 4,250,048 A | 2/1981 | Leveskis ...................... 252/142 |
| 5,192,460 A | 3/1993 | Thomas et al. ............... 252/142 |
| 5,290,361 A | * 3/1994 | Hayashida et al. ............. 134/2 |
| 5,322,635 A | 6/1994 | Hieatt et al. ................... 252/82 |
| 5,451,335 A | 9/1995 | Hieatt et al. ................... 252/82 |
| 5,645,737 A | 7/1997 | Robinson et al. ............... 216/99 |
| 5,705,089 A | * 1/1998 | Sugihara et al. ............ 252/79.1 |
| 5,935,869 A | * 8/1999 | Huynh et al. ................. 438/692 |
| 5,942,131 A | * 8/1999 | Robinson et al. ............... 216/99 |
| 5,981,454 A | * 11/1999 | Small .......................... 510/175 |

FOREIGN PATENT DOCUMENTS

| | | |
|---|---|---|
| EP | 0 560 324 A1 | 9/1993 |
| EP | 0 812 011 A2 | 12/1997 |
| WO | WO 95/13350 | 5/1995 |
| WO | WO 98/40453 | 9/1998 |

OTHER PUBLICATIONS

Database WPI, Section Ch, Week 198638, Derwent Publications Ltd., London, GB: Class E19, AN 1986–251074, XP002155207 & SU 1 210 053 A (Light Ind Elec Equip), Feb. 7, 1986, abstract only.

* cited by examiner

*Primary Examiner*—Charles Boyer

(57) ABSTRACT

A composition and method are provided for cleaning contaminants from the surface of a semiconductor wafer after the wafer has been chemically-mechanically polished. The cleaning composition comprises a carboxylic acid, an amine-containing compound, a phosphonic acid, and water. The cleaning composition is useful in removing abrasive remnants as well as metal contaminants from the surface of a semiconductor wafer following chemical-mechanical polishing.

16 Claims, No Drawings

CLEANING SOLUTION FOR SEMICONDUCTOR SURFACES FOLLOWING CHEMICAL-MECHANICAL POLISHING

TECHNICAL FIELD OF THE INVENTION

The present invention relates to a cleaning composition and a method of cleaning semiconductor surfaces following chemical-mechanical polishing.

BACKGROUND OF THE INVENTION

A semiconductor wafer is typically composed of a substrate, such as a silicon or gallium arsenide wafer, on which a plurality of transistors have been formed. Transistors are chemically and physically connected into a substrate and are interconnected through the use of well known multilevel coplanar interconnects to form functional circuits. Typical multilevel interconnects are comprised of stacked thin-films consisting of, for example, one or more of the following: titanium (Ti), titanium nitrate (TiN), copper (Cu), aluminum (Al), tungsten (W), tantalum (Ta), and various combinations thereof.

The traditional technique for forming functional multilevel coplanar interconnects has involved planarizing the surface of the interconnects via chemical-mechanical polishing (CMP). CMP involves the concurrent chemical and mechanical polishing of an overlying first layer to expose the surface of a non-planar second layer on which the first layer has formed. A more detailed explanation of chemical-mechanical polishing is set forth in U.S. Pat. Nos. 4,671,851, 4,910,155, and 4,944,836.

CMP processes typically involve a polishing slurry composition that contains abrasive particles, such as silica or alumina, in an acidic or basic solution. Typical polishing slurry compositions are applied to the semiconductor surface and then are washed from the wafer surface with an aqueous solution after CMP is completed. Although aqueous solutions are suitable for removing some of the polishing slurry, they tend to leave undesirable contaminants on the wafer surface. In particular, the nonmetal substrate (e.g., silicon dioxide) of the polished wafer is often contaminated with slurry remnants, such as silica or alumina abrasive particles, and with metal ions from the polishing composition and from the material being polished. Such contaminants have an adverse effect on semiconductor wafer performance.

Typical post-CMP cleaning compositions have limited success in cleaning semiconductor wafers. In particular, cleaning compositions are not typically effective at removing both slurry particle remnants and metal ion remnants from the surface of the polished semiconductor wafer. For example, U.S. Pat. No. 4,051,057 discloses a composition comprising a strong oxidizing agent that removes copper oxides from a metal substrate. This disclosed pickling composition, however, is not particularly suited for removing slurry particle remnants from semiconductor wafers. U.S. Pat. No. 5,837,662 discloses a process for cleaning both slurry particle and metal ion remnants, but the process involves two distinct cleaning compositions: an oxidizing agent to remove slurry particles and an acidic solution to remove metal ions from the polished semiconductor wafer.

Accordingly, a need remains for a composition and/or method to clean contaminants from a semiconductor surface, which contaminants originate from both the polishing slurry composition and from the material being polished. In particular, it would be highly desirable to have a cleaning composition that removes both slurry particle and metal ion remnants from a polished surface, in order to minimize contamination of a wafer substrate following CMP. Moreover, the cleaning composition desirably does not remove metal ions from the metal surface in order to minimize surface roughening. This type of cleaning composition and/or method maximizes semiconductor wafer performance. The present invention seeks to provide such a semiconductor cleaning composition. These and other advantages of the present invention will be apparent from the description of the invention provided herein.

BRIEF SUMMARY OF THE INVENTION

The present invention is directed to a cleaning composition for cleaning slurry particles and metal ions from a semiconductor surface after the surface has been chemically-mechanically polished. The post-CMP cleaning composition of the present invention comprises a carboxylic acid, an amine-containing compound, a phosphonic acid, and water. The carboxylic acid, the amine-containing compound, and the phosphonic acid can be selected to tailor the cleaning composition to provide effective cleaning of a variety of semiconductor surfaces of both slurry particle and metal ion contaminants following CMP.

The present invention also provides a method of cleaning a semiconductor following chemical-mechanical polishing using the composition of the present invention. The method comprises contacting the polished semiconductor surface with the cleaning composition of the present invention.

DESCRIPTION OF THE PREFERRED EMBODIMENTS

The present invention provides a cleaning composition comprising a carboxylic acid, an amine-containing compound, a phosphonic acid, and water. The composition is directed to cleaning slurry particle and metal ion remnants from a semiconductor surface after the surface has been chemically-mechanically polished.

The carboxylic acid of the present invention can be any suitable carboxylic acid. Suitable carboxylic acids include, for example, formic, acetic, propionic, butyric, aleric, citric, glycolic, lactic, tartaric, acrylic, succinic, gluconic, benzoic, salicylic acids, and mixtures thereof.

Particularly desirable carboxylic acids are those carboxylic acids comprising at least two acid groups. Preferably, the carboxylic acid comprises three acid groups, such as citric acid.

Any suitable amount of carboxylic acid can be present in the cleaning composition of the present invention. The carboxylic acid desirably is present in the cleaning composition in an amount of about 2 wt. % or less. Preferably, the carboxylic acid is present in the cleaning composition in an amount of about 1 wt. % or less, e.g., about 0.2–0.7 wt. %.

Any suitable amine-containing compound (i.e., a compound that contains at least one amine group) can be used in the context of the present invention. Suitable amine-containing compounds include methylamine, dimethylamine, trimethylamine, ethylamine, diethylamine, triethylamine, ethanolamine, diethanolamine, diethanolamine cocate, triethanolamine, isopropanolamine, diisopropanolamine; triisopropanolamine, nitrosodiethanolamine, and mixtures thereof.

Desirably, the amine-containing compound is a nonionic surfactant. Alternatively, or in addition, the amine-containing compound desirably comprises at least two amine groups. The amine-containing compound also can comprise other groups, particularly an alcohol group. Preferably, the amine-containing compound comprises at least two amine groups and an alcohol group. Preferred amine-containing compounds are diethanolamine, diethanolamine cocate, nitrosodiethanolamine, and mixtures thereof.

Any suitable amount of the amine-containing compound can be used in the context of the present invention. The amine-containing compound desirably is present in the cleaning composition in an amount of about 10 wt. % or less. Preferably, the amine-containing compound is present in the cleaning composition in an amount of about 2 wt. % or less. More preferably, the amine-containing compound is present in the cleaning composition in an amount of about 1 wt. % or less, e.g., about 0.01–0.05 wt. %.

Any suitable phosphonic acid can be used in the context of the present invention. Suitable phosphonic acids include 1-hydroxyethylidene-1,1-diphosphonic acid, aminotris(methylenephosphonic acid), N-carboxymethylaminomethanephosphonic acid, 1-hydroxyethane-1,1-diphosphonic acid, dialkyl phophonates, dialkyl alkylphosphonates, and mixtures thereof. Preferably, the phosphonic acid contains three or more phosphorous atoms, such as aminotris (methylenephosphonic acid).

Any suitable amount of phosphonic acid can be present in the cleaning composition of the present invention. The phosphonic acid desirably is present in the cleaning composition in an amount of about 2 wt. % or less. Preferably, the phosphonic acid is present in the cleaning composition in an amount of about 1 wt. % or less, e.g., about 0.1–0.5 wt. %.

The present invention also provides a method of cleaning a semiconductor surface (or other suitable surface) after the surface has been chemically-mechanically polished. This method comprises contacting a semiconductor after CMP with a cleaning composition as described herein. A semiconductor can be treated with the cleaning composition by any suitable technique. For example, the cleaning composition can be applied to the substrate by brushing or spraying.

The pH of the cleaning composition of the present invention is maintained in a range suitable for its intended end-use. The cleaning composition desirably has a pH of about 4–6. Preferably, the cleaning composition has a pH of about 4.5–5.5.

The following examples further illustrate the present invention but, of course, should not be construed as in any way limiting its scope.

EXAMPLE 1

This example illustrates the significance of the presence of a carboxylic acid in the cleaning composition of the present invention in reducing slurry particle remnants and metal ion remnants on the surface of a substrate.

Four oxide wafers were polished for 30 seconds with a copper-contaminated slurry. The oxide wafers were then washed with either of two cleaning solutions: (1) a cleaning composition of the present invention comprising 0.5 wt. % citric acid, 0.2 wt. % aminotris(methylene phosphonic acid), 0.02 wt.% diethanolamine cocate, and the balance water, with a pH of 10, or (2) an alternate cleaning composition comprising 0.2 wt. % aminotris(methylene phosphonic acid), 0.02 wt. % diethanolamine cocate, and the balance water, with a pH of 10. Following the use of the cleaning compositions, the light point defect (LPD at two different minimum threshold values) (a measure of slurry particle remnants) and metal ion remnant amount for copper (Cu) (at two different points on the wafer) were determined, with the resulting data set forth in Table 1.

TABLE 1

| Slurry Particle/Metal Ion Remnant Removal | | | | |
|---|---|---|---|---|
| Cleaning | LPD | LPD | Cu ($10^{10}$/cm$^2$) | |
| Solution | (0.17 μm) | (0.25 μm) | Center | Edge |
| Invention | 179 | 7 | 13.1 | 29.0 |
| Invention | 158 | 10 | 6.2 | 8.2 |
| Alternate | 368 | 23 | 35 | 48 |
| Alternate | 344 | 21 | 28.6 | 27.5 |

As is apparent from the data set forth in Table 1, the cleaning composition of the present invention that contained a carboxylic acid significantly reduced the slurry particle and metal ion remnants on the oxide wafer on which it was used, as compared to the alternate cleaning composition that did not contain a carboxylic acid. In particular, the oxide wafer washed with the cleaning composition that contained a carboxylic acid had a lower light point defect (LPD) and copper ion amount than the oxide wafer washed with the cleaning composition that did not contain a carboxylic acid.

EXAMPLE 2

This example illustrates that the cleaning composition of the present invention can be more successful in reducing slurry particle remnants and metal ion remnants on a substrate when the cleaning composition has a pH in the acidic range, rather than a pH in the alkaline range.

Two oxide wafers were polished for 30 seconds with a copper-contaminated slurry. The oxide wafers were then washed with either of two cleaning solutions: (1) a cleaning composition comprising 0.5 wt. % citric acid, 0.2 wt. % aminotris(methylene phosphonic acid), 0.02 wt. % diethanolamine cocate, and the balance water, with a pH of 5, or (2) a cleaning composition comprising 0.5 wt. % citric acid, 0.2 wt. % aminotris(methylene phosphonic acid), 0.02 wt. % diethanolamine cocate, and the balance water, with a pH of 10. Following the use of the cleaning compositions, the light point defect (LPD at two different minimum threshold values) (a measure of slurry particle remnants) and metal ion remnant amount for copper (Cu) (at two different points on the wafer) were determined, with the resulting data set forth in Table 2.

TABLE 2

| Slurry Particle/Metal Ion Remnant Removal | | | | |
|---|---|---|---|---|
| Cleaning | LPD | LPD | Cu ($10^{10}$/cm$^2$) | |
| Solution | (0.17 μm) | (0.25 μm) | Center | Edge |
| pH = 5 | 162 | 4 | 8.1 | 16.8 |
| pH = 10 | 179 | 7 | 13.1 | 29.0 |

As is apparent from the data set forth in Table 2, the acidic cleaning composition demonstrated greater success in reducing the slurry particle and metal ion remnants on the oxide wafer on which it was used, as compared to the alkaline cleaning composition. In particular, the oxide wafer washed with the acidic cleaning composition had a lower light point defect (LPD) and copper ion amount than the oxide wafer washed with the alkaline cleaning composition.

EXAMPLE 3

This example illustrates the excellent slurry particle removal and metal ion removal properties of the cleaning composition of the present invention, after application to a substrate, as compared to an alternate cleaning composition.

Four oxide wafers were polished for 30 seconds with a copper-contaminated slurry. The oxide wafers were then washed with either of two cleaning solutions: (1) a cleaning composition of the present invention comprising 0.5 wt. % citric acid, 0.2 wt. % aminotris(methylene phosphonic acid), 0.02 wt. % diethanolamine cocate, and the balance water, with a pH of 5, or (2) an alternate cleaning composition comprising 0.2 wt. % aminotris(methylene phosphonic acid), 0.02 wt. % diethanolamine cocate, and the balance water, with a pH of 10. Following the use of the cleaning compositions, the light point defect (LPD at two different minimum threshold values) (a measure of slurry particle remnants) and metal ion remnant amount for copper (Cu) (at two different points on the wafer) were determined, with the resulting data set forth in Table 3.

TABLE 3

Slurry Particle/Metal Ion Remnant Removal

| Cleaning Solution | LPD (0.17 μm) | LPD (0.25 μm) | Cu ($10^{10}$/cm$^2$) Center | Edge |
|---|---|---|---|---|
| Alternate | 368 | 23 | 35 | 48 |
| Alternate | 344 | 21 | 28.6 | 27.5 |
| Invention | 162 | 4 | 8.1 | 16.8 |
| Invention | 172 | 7 | 4.5 | 7.4 |

As is apparent from the data set forth in Table 3, the cleaning composition of the present invention significantly reduces the slurry particle and metal ion remnants on both oxide wafers on which it was used. The alternate cleaning composition did not perform as well as the cleaning composition of the present invention. In particular, the oxide wafers washed with the cleaning composition of the present invention had a lower light point defect (LPD) and copper ion amount than the oxide wafers washed with the alternate cleaning composition. This data also demonstrates the importance of a carboxylic acid in conjunction with the other components of the cleaning composition of the present invention in achieving good cleaning of slurry particle and metal ion remnants.

EXAMPLE 4

This example further illustrates the excellent slurry particle removal and metal ion removal properties of the cleaning composition of the present invention, after application to a substrate, as compared to the alternate cleaning composition.

Two oxide wafers were polished for 30 seconds with a iron-contaminated slurry. The oxide wafers were then washed with either of two cleaning solutions: (1) a cleaning composition of the present invention comprising 0.5 wt. % citric acid, 0.2 wt. % aminotris(methylene phosphonic acid), 0.02 wt. % diethanolamine cocate, and the balance water, with a pH of 5, or (2) an alternate cleaning composition comprising 0.2 wt. % aminotris (methylene phosphonic acid), 0.02 wt. % diethanolamine cocate, and the balance water, with a pH of 10. Following the use of the cleaning compositions, the light point defect (LPD at two different minimum threshold values) (a measure of slurry particle remnants) and metal ion remnant amount for iron (Fe) (at two different points on the wafer) were determined, with the resulting data set forth in Table 4.

TABLE 4

Slurry Particle/Metal Ion Remnant Removal

| Cleaning Solution | LPD (0.17 μm) | LPD (0.25 μm) | Fe ($10^{10}$/cm$^2$) Center | Edge |
|---|---|---|---|---|
| Alternate | 344 | 21 | 1.5 | 3.4 |
| Invention | 172 | 7 | <0.7 | 1.9 |

As is apparent from the data set forth in Table 4, the cleaning composition of the present invention significantly reduces the slurry particle and metal ion remnants on the oxide wafer on which it was used. The data also demonstrate superior cleaning of slurry particles and iron ions from the oxide wafer as compared to the alternate cleaning composition. In particular, the oxide wafer washed with the cleaning composition of the present invention had a lower light point defect (LPD) and iron ion amount than the oxide wafer washed with the alternate cleaning composition.

All of the references cited herein, including patents, patent applications, and publications, are hereby incorporated in their entireties by reference.

While this invention has been described with an emphasis upon preferred embodiments, it will be obvious to those of ordinary skill in the art that variations of the preferred embodiments may be used and that it is intended that the invention may be practiced otherwise than as specifically described herein. Accordingly, this invention includes all modifications encompassed within the spirit and scope of the invention as defined by the following claims.

What is claimed is:

1. A method for cleaning contaminants from the surface of a semiconductor wafer after the semiconductor wafer has been chemically-mechanically polished, the method comprising contacting the surface of the semiconductor wafer having abrasive particle and metal ion contaminants with a composition comprising a carboxylic acid, an amine-containing compound, a phosphonic acid, and water, wherein the amine-containing compound and the phosphonic acid are distinct compounds.

2. The method of claim 1, wherein said composition does not comprise a mineral acid.

3. The method of claim 1, wherein said carboxylic acid is present in an amount of about 2 wt. % or less, said amine-containing compound is present in an amount of about 0.1 wt. % or less, and said phosphonic acid is present in an amount of about 2 wt. % or less.

4. The method of claim 3, wherein said carboxylic acid is selected from the group consisting of formic, acetic, propionic, butyric, valeric, citric, glycolic, lactic, tartaric, acrylic, succinic, gluconic, benzoic, salicylic acid, and mixtures thereof.

5. The method of claim 3, wherein said carboxylic acid comprises at least two acid groups.

6. The method of claim 3, wherein said carboxylic acid comprises three acid groups.

7. The method of claim 3, wherein said carboxylic acid is citric acid.

8. The method of claim 3, wherein said amine-containing compound is selected from the group consisting of methylamine, dimethylamine, trimethylamine, ethylamine, diethylamine, triethylamine, ethanolamine, diethanolamine, diethanolamine cocate, triethanolamine, isopropanolamine, diisopropanolamine, triisopropanolamine, nitrosodiethanolamine, and mixtures thereof.

9. The method of claim 3, wherein said amine-containing compound is a nonionic surfactant.

10. The method of claim 3, Therein said amine-containing compound comprises at least two amine groups.

11. The method of claim 3, wherein said amine-containing compound comprises an alcohol group.

12. The method of claim 11, wherein said amine-containing compound is diethanolamine or a derivative thereof.

13. The method of claim 3, wherein said phosphonic acid is selected from the group consisting of 1-hydroxyethylidene-1,1-diphosphonic acid, aminotris (methylenephosphonic acid), N-carboxymethylaminomethanephosphonic acid, 1-hydroxyethane-1,1-diphosphonic acid, dialkyl phosphonates, dialkyl alkylphosphonates, and mixtures thereof.

14. The method of claim 13, wherein said phosphonic acid contains three phosphorous atoms.

15. The method of claim 13, wherein said phosphonic acid is aminotris(methylenephosphonic acid).

16. The method of claim 3, wherein said composition has a pH of about 4 to about 6.

* * * * *